United States Patent [19]
Strain et al.

[11] 3,935,477
[45] Jan. 27, 1976

[54] ANALOG INVERTER FOR USE IN CHARGE TRANSFER APPARATUS

[75] Inventors: Robert Joseph Strain, Plainfield; Robert Henry Walden, Warren, both of N.J.

[73] Assignee: Bell Telephone Laboratories, Incorporated, Murray Hill, N.J.

[22] Filed: Oct. 7, 1974

[21] Appl. No.: 512,848

Related U.S. Application Data

[63] Continuation of Ser. No. 353,629, April 23, 1973, abandoned.

[52] U.S. Cl. ............ 307/214; 307/221 D; 307/304; 357/24
[51] Int. Cl.² ................. H03K 19/40; H01L 27/04; H01L 29/80
[58] Field of Search .......... 357/24; 307/221 D, 214, 307/304

[56] References Cited
UNITED STATES PATENTS

| | | | |
|---|---|---|---|
| 3,758,794 | 9/1973 | Kosonocky | 357/24 |
| 3,777,186 | 12/1973 | Chang | 357/24 |
| 3,801,883 | 4/1974 | Tiemann | 357/24 |

OTHER PUBLICATIONS

Engeler et al., "A Memory System Based on Surface-Charge TRansport," IEEE *Jour. of Solid-State Circuits*, Vol. SC-6, No. 5, Oct. 1971, pp. 306-313.
McDermott, "New Surface-Charge Transistor Has High Data Storage Potential," *Electronic Design*, Vol. 18, No. 26, Dec. 20, 1970, p. 28.

*Primary Examiner*—William D. Larkins
*Attorney, Agent, or Firm*—M. J. Urbano

[57] ABSTRACT

In charge transfer apparatus, an analog inverter comprises a charge storage medium to which are applied varying voltages through a plurality of electrodes, illustratively: a source electrode, a reference electrode and a collector electrode arranged in tandem. Between the source and reference electrodes there is a first control electrode and, in one embodiment, between the reference and collector electrodes there is a second control electrode and a signal electrode. With the electrical signal to be inverted connected to the signal electrode, analog inversion, a form of complementing function, occurs as follows: (1) during the first phase of the clock cycle, a voltage is applied to the first control electrode effective to cause a fixed amount of charge to be transferred from the source to a reference potential well established under the reference electrode; (2) during the second phase of the clock cycle, a voltage is applied to the second control electrode effective to increase the surface potential thereunder and to permit charge to be transferred into a potential well under the collector electrode; this charge establishes a new surface potential which, apart from an additive constant is equal to the inverted signal voltage. In other embodiments in which the analog signal is of a self-strobing type (e.g., the output of a C4D or BB) the second control electrode is not required.

6 Claims, 8 Drawing Figures

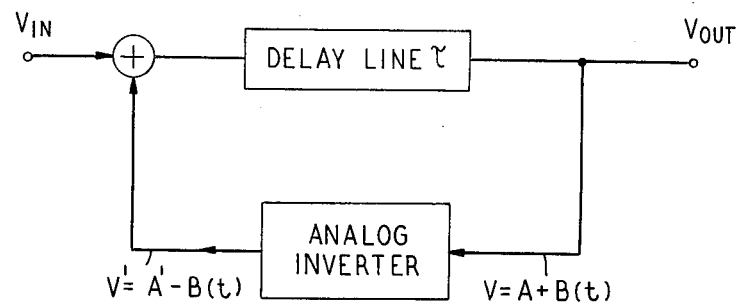
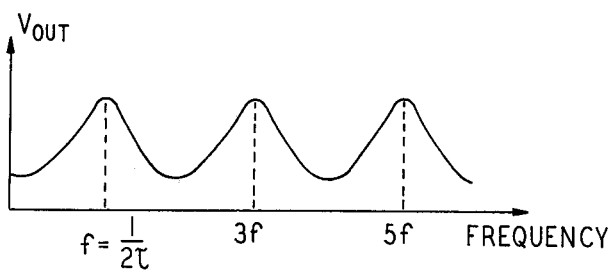
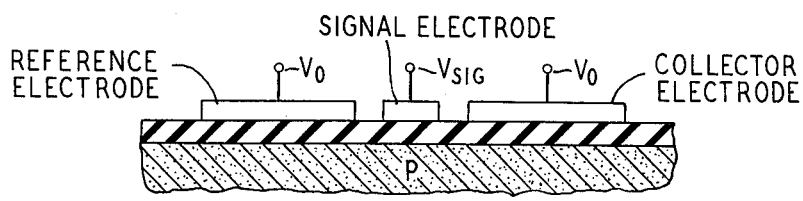
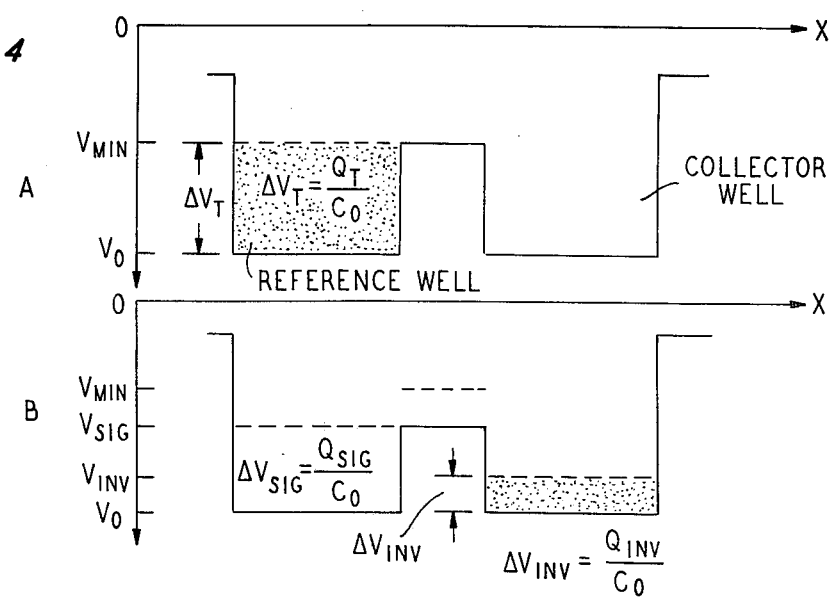

ANALOG INVERTER FOR USE IN CHARGE TRANSFER APPARATUS

This application is a continuation of application ser. No. 353,629, filed Apr. 23, 1973, now abandoned.

BACKGROUND OF THE INVENTION

This invention relates to analog inverters and, more particularly, to such inverters for use in charge transfer apparatus.

In an analog delay line filter, as shown in FIG. 1, an input signal is passed through a delay line, and the output of the delay line is fed back to the input of the delay line through an analog inverter, the output of which is the complement of its input. That is, if the input voltage V of the analog inverter is given by $$V = A + B(t) \quad (1)$$

where $A$ is some DC level and $B(t)$ is the time varying portion of the input, then the output $V'$ of the inverter is given by $$V' = A' - B(t) \quad (2)$$

where $A'$ is another DC level which may or may not be related to level $A$. The inverted signal is combined with the input in a summing arrangement, the sum constituting the input to the delay line. The arrangement as a whole operates as a bankpass filter having a frequency response of the type depicted in FIG. 2.

Illustratively, the delay line is a charge transfer device (CTD) in the form of a dynamic shift register. The CTD in turn may be either a charge coupled device (CCD) of the type described in copending application Ser. No. 196,933 (Boyle 19-26), filed on Nov. 9, 1971, now U.S. Pat. No. 3,858,232, a C4D of the type described in copending application Ser. No. 262,787 (Krambeck 10-28-8) filed on June 14, 1972, or a bucket brigade (BB) device of the type described in U.S. Pat. No. 3,660,697 (Berglund 6-8) issued on May 2, 1972. The use of a BB device as an analog delay line is described in an article by L. Boonstra et al. in Electronics, Vol. 45, pages 64-71 (Feb. 28, 1972). Advantageously, therefore, if both the analog inverter and the delay line of the aforementioned bandpass filter are CCD or BB devices, the manufacture of the filter would be simplified, e.g., both the delay line and the inverter could be fabricated on a single chip by well-known integrated circuit technology. Moreover, interface problems, such as impedance matching and loading due to stray capacitance, would be alleviated.

SUMMARY OF THE INVENTION

In accordance with an illustrative embodiment of our invention, an analog inverter comprises a charge storage medium to which are applied varying voltages through a plurality of electrodes, illustratively: a source electrode, a first control electrode, a reference electrode, a second control electrode, a signal electrode and a collector electrode arranged in tandem in the order recited. Analog inversion, a form of complementing function, occurs by applying an electrical signal to be inverted to the signal electrode and by connecting the control electrodes to separate phases of a two-phase clock. During the first phase of the clock cycle, a voltage is applied to the first control electrode effective to cause a fixed amount of charge to be transferred from the source to a reference potential well established under the reference electrode. During the second phase of the clock cycle, a voltage is applied to the second control electrode effective to increase the surface potential thereunder and to permit charge to be transferred into a potential well under the collector electrode which is also connected to the second phase of the clock. This charge establishes a new surface potential which, apart from an additive constant, is equal to the inverted signal voltage. In other embodiments in which the analog signal is of a self-strobing type (e.g., the output of a C4D or BB), the second control electrode is not required.

BRIEF DESCRIPTION OF THE DRAWING

Our invention, together with its various features and advantages, can be easily understood from the following more detailed description taken in conjunction with the accompanying drawing, in which:

FIG. 1 is a block-diagrammatic view of an analog delay line bandpass filter;

FIG. 2 is a graph of an illustrative transmission characteristic of the filter of FIG. 1;

FIG. 3 is a cross-sectional view of a structure used in defining analog inversion as the term is utilized herein;

FIG. 4 Parts A and B, are graphs depicting the surface potential in the storage medium of FIG. 3;

DETAILED DESCRIPTION

Analog Inversion Defined

Figure 5:
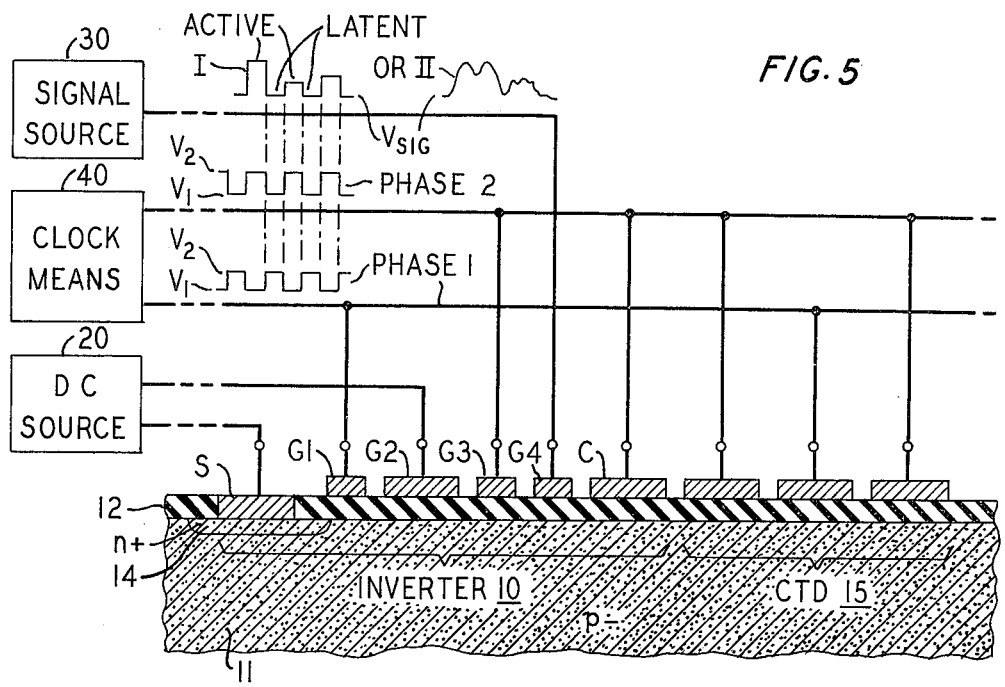
FIG. 5 is a cross-sectional view of an illustrative embodiment of our invention and includes, in addition, circuit connections to various voltage sources.

Before discussing the various structural embodiments of our invention, it will be helpful to first define analog inversion as it will be used hereinafter. Consider FIG. 3 which shows reference, signal and collector electrodes disposed in tandem on a thin insulator which in turn is formed on a major surface of a p-type storage medium. For convenience and simplicity the following assumptions have been made: (1) that the voltage drop across the insulator is negligible so that the surface potential in the storage medium under each electrode equals the voltage applied to that electrode; (2) that the capacitances of the reference and collector electrodes are equal to $C_o$; (3) that signal voltage $V_{sig}$ applied to the signal electrode has a minimum value designated $V_{min}$; and (4) that the same voltage $V_o$ is applied to the reference and collector electrodes. In addition, $V_o$ should be large enough to permit inversion over the full voltage swing of $V_{sig}$; that is $V_o$ should satisfy the inequality $$V_{sig} < \frac{V_o + V_{min}}{2} \quad (3)$$

otherwise charge transferred from the reference well to the collector well may tend to flow back into the reference well whenever the inequality sign is reversed in expression (3) above.

Having made the foregoing assumptions, consider now that by means not shown an amount of charge $Q_T$ is transferred into the reference well at a time when $V_{sig} = V_{min}$. This charge causes the surface potential under the reference electrode to decrease from $V_o$ to $V_{min}$, as shown in FIG. 4, Part A. The change in surface potential $\Delta V_T$ is given by $$\Delta U_T = V_o - V_{min} = Q_T/C_o \tag{4}$$

Now suppose that $V_{sig}$ is increased above $V_{min}$ as shown in FIG. 4, Part B. Then some amount of charge, designated $Q_{inv}$, will be transferred from the reference well to the collector well. The amount of charge $Q_{sig}$ remaining in the reference well is related to the signal voltage $V_{sig}$ and is given by $$Q_{sig} = \Delta \approx -\Psi_{sig} C_o = (V_o - V_{sig})C_o \tag{5}$$

On the other hand, the charge $Q_{inv}$ transferred to the collector well is related to the analog inversion, or complement, of the applied signal and is given by $$Q_{inv} = \Delta V_{inv} C_o = (V_o - V_{inv})C_o \tag{6}$$

where $V_{inv}$ is the voltage to which the potential under the collector electrode decreases upon the transfer of $Q_{inv}$. Note that $Q_T = Q_{sig} + Q_{inv}$.

To demonstrate that inversion as defined by equations (1) and (2) has occurred, consider equation (1) with $V = V_{sig}$; $A = V_{min}$ and $B(t) = V_{sig} - V_{min}$, thus:

$$V = A + B(t) \text{ and} \tag{1}$$
$$V_{sig} = V_{min} + (V_{sig} - V_{min}) . \tag{7}$$

On the other hand, $$V_{inv} = V_o - \Delta V_{inv} = V_o - Q_{inv}/C_o \tag{8}$$

$$= V_o - \frac{(Q_T - Q_{sig})}{C_o} = V_o - \frac{(\Delta V_T C_o - \Delta V_{sig} C_o)}{C_o} \tag{9}$$

$$= V_o - (\Delta V_T - \Delta V_{sig}) = V_o - (V_{sig} - V_{min}) \tag{10}$$
$$V' = A' - B(t)$$

where $V' = V_{inv}$ and $A' = V_o$. Thus, analog inversion is indeed accomplished.

STRUCTURE

The manner in which the foregoing principles of analog inversion are implemented in an illustrative embodiment of our invention will now be described with specific reference to FIGS. 5–6. As shown in the partial cross-sectional view of FIG. 5, one embodiment of our analog inverter 10 comprises a storage medium 11, preferably a semiconductor such as silicon, and a plurality of electrodes including: a source electrode S, a collector electrode C and four gate electrodes G1, G2, G3 and G4 arranged in tandem between the source and collector electrodes. Gate electrodes G2 and G4 will hereinafter be referred to, respectively, as the "reference" and "signal" electrodes, whereas gate electrodes G1 and G3 will be referred to as "control" electrodes. Inasmuch as the latter electrodes are not utilized to store charge, but function primarily as gates, they may be made as narrow as possible, consistent with available fabrication technology and with defining a suitable potential barrier for control of the transfer of charge into and out of the reference potential well.

Figure 6:
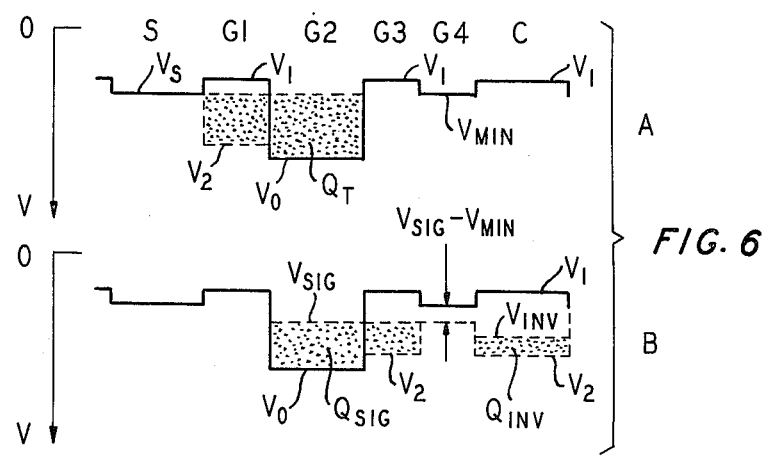
FIG. 6, Parts A and B, show the variation of surface potential during sequential parts of the clock cycle of the embodiment of our invention depicted in FIG. 5.

As shown in FIG. 5, the storage medium 11 illustratively comprises a p⁻-type semiconductor on which is formed a thin insulative layer 12, typically thermally grown silicon dioxide. A window is cut in the insulative layer by well-known photolithographic techniques to permit the formation, typically by diffusion, of an $n^+$ zone 14 in p⁻-type medium 11. The p-n junction thereby formed in the storage medium functions as a source when an appropriate voltage is applied thereto via metallic electrode S formed in the window of insulative layer 12. This p-n junction is reverse biased with respect to the medium 11, and held at a suitable reference potential $V_s$ by DC source 20. Electrodes G1, G2, G3, G4 and C, on the other hand, are formed directly on insulator 12 in typical MOS fashion. Reference electrode G2 is also connected to DC source 20 to establish in storage medium 11 under G2 a reference potential well having a maximum voltage $V_o$. Control electrodes G1 and G3 are connected respectively to PHASE 1 and PHASE 2 of two-phase clock means 40 which varies between voltage levels $V_1$ and $V_2$ ($V_1 < V_s < V_2$). Note that for an n-channel device (p⁻-type medium 11) more positive voltages increase the surface potential of medium 11. Signal electrode G4 is connected to a signal source 30 which supplies, illustratively, either a PAM output I of the type typically generated by a CTD or a purely analog signal II. In addition, the signal to be inverted may be either of the self-strobing variety, e.g., the PAM output of a BB (see Berglund Case 6-8, supra) or the PAM output of a C4D (See Krambeck Case 10-28-8, supra) or of the non-self-strobing variety (e.g., a PAM output of a conventional CCD or a purely analog signal II).

SELF-STROBING DEFINED

The PAM signal I (FIG. 5) of a CTD has an active phase, which carries information in the form of an amplitude modulated pulse, and a latent phase, which carries no information. Note, the term "phase" as it modifies "latent" and "active" denotes one-half of the period of the PAM signal and is to be contrasted with the terms PHASE 1 and PHASE 2 which denote the two phases, 180° apart, of clock means 40.

As used hereinafter, a PAM signal I will be deemed to be self-strobing if it satisfies two conditions: (1) it is coincident with the clock signal applied to the second control electrode G3 (i.e., the active phase of signal I is coincident with the active phase of PHASE 2), and (2) the voltage during the latent phase of signal I is sufficiently low (relative to the surface potential of the reference well when filled with charge) that little, if any, charge flows from the reference well to the collector during the latent phase. This voltage corresponds to $V_{min}$ hereinafter defined with respect to FIG. 6.

A signal which fails to satisfy either of the above conditions will be called "non-self-strobing." Typically, such a signal might be a PAM signal coincident with the clock signal applied to control electrode G3, but which, during its active phase, supplies a lower voltage than during its latent phase. Such a signal would cause undesirable flow of current from the reference well to the collector if the second control electrode G3 were not used to maintain thereunder a relatively low surface potential during the latent phase.

OPERATION

Assume for the purposes of the immediately following description that the signal to be inverted is of the non-self-strobing variety and is a PAM signal I coincident with PHASE 2 of clock means 40, FIG. 5. In this case, control electrode G3 is utilized. Assume also for simplicity that the voltage drop across insulative layer 12 is negligible so that the surface potential equals the applied voltage. Then, initially, the surface potential can be depicted by the solid line in FIG. 6, Part A. In operation during the first half (PHASE 1) of the two-phase clock cycle, the voltage applied to control electrode G1 increases from $V_1 < V_s$ to $V_2 < V_s$, thereby transferring an amount of charge $Q_T$ into the reference potential well under G1 and G2. This charge causes the surface potential under G1 and G2 to decrease to $V_s$ as depicted by the upper broken line. At the same time, the opposite phase (PHASE 2) is applied to G3 and C so that surface potential thereunder is at $V_1$. Since the surface potential under G3 ($V_1$) is less than that under G2 ($V_s$), no charge is transferred into the collector. However, during the next half of the clock cycle (PHASE 2), as shown in FIG. 6, Part B, the voltage applied to G1 decreases from $V_2$ to $V_1$ to terminate charging of the reference potential well. Simultaneously, the voltage applied to collector electrode C and control electrode G3 increases from $V_1$ to $V_2$ and the voltage applied to signal electrode G4 increases from $V_{min}$ to $V_{sig} < V_{min}$. Consequently, the amount of charge remaining in the reference well under electrodes G3 and G2 must decrease to permit the surface potential thereunder to decrease to $V_{sig}$, as shown by the upper broken line in FIG. 6, Part B; that is, the amount charge remaining is $Q_{sig}$ and an amount of charge $Q_{inv}$, proportional to the inverted signal, is transferred into the collector. $Q_{inv}$ in turn causes the surface potential under the collector to decrease from $V_2$ to $V_{inv}$.

The charge $Q_{inv}$ is the output of inverter 10 and may be coupled to the input of a CTD 15, shown in FIG. 5 to be for example a CCD. CTD 15 may be a delay line used in an analog filter of the type shown in FIG. 1. Under such circumstances, the first stage of CTD 15 should be connected to the same phase of clock means 40 as the collector C, i.e., PHASE 2 in the above embodiment. In fact, the signal applied to signal electrode G4 of inverter 10 may very well be the output of such a CTD 15—again in the fashion shown in the filter of FIG. 1. Consider, that such a CTD delivers an amount of charge $\Delta Q_{in}$ to the inverter via a suitable voltage applied to electrode G4. Then the output $\Delta Q_{out}$ of the inverter is generally $$\Delta Q_{out} = -k \Delta Q_{in} \tag{11}$$

where $k$ is a positive constant. If electrodes G2 and G3 are large relative to the CTD electrodes, then $k$ will be greater than unity, and conversely. The constant $k$ is a controllable quantity and, in fact, it is preferred, that $k = 1$, which can be attained by designing the inverter 10 so that the capacitances of G2 and G3 satisfy approximately the relationship $$C_{(G2 + G3)} = 2C_{CTD} \tag{12}$$

where $C_{CTD}$ is the capacitance of the output stage, i.e., storage site, of the CTD.

Where the signal to be inverted is a non-self-strobing PAM signal I (FIG. 5), inversion occurs as described above. For a purely analog signal II (FIG. 5), the output is a sampled version of the analog inversion with the sampling rate corresponding to the clock cycle rate.

However, where the signal is self-strobing and coincident with PHASE 2, then control electrode G3 can be eliminated, i.e., G2 and G4 can be placed adjacent to one another.

Figure 7:
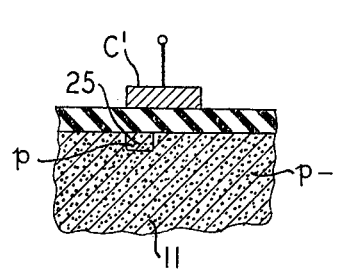
FIG. 7 is a cross-sectional view of a portion of an alternative embodiment of our invention in which a localized portion of immobile charge is utilized to produce an asymmetrical potential well under collector electrode C'.
Figure 8:
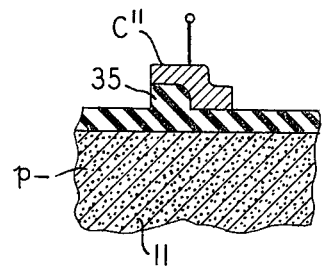
FIG. 8 is a cross-sectional view of a portion of another embodiment of our invention in which a stepped insulative layer is utilized to produce an asymmetrical portential well under collector electrode C''.

In any event, the likelihood of distortion, which might occur from the backward flow of charge from the collector into potential wells under G4, G3 and/or G2, can be reduced by providing under the collector electrode C an asymmetrical potential profile. This function can be performed by either of the alternative embodiments shown in FIG. 7 or FIG. 8. In both cases it will be noted that collector electrode C of FIG. 5 has been replaced: in FIG. 7 by an electrode C' and a zone 20 of immobile charge carriers asymmetrically located thereunder in storage medium 11; and in FIG. 8 by an electrode C" and an insulative layer 35 thereunder of nonuniform thickness. The manner in which these configurations produce an asymmetrical potential profile is more fully described in U.S. Pat. No. 3,651,349 (Kahng 22-5), issued on Mar. 21, 1972, with respect to the use of stepped insulative layers, and copending application Ser. No. 157,509 (Krambeck 7-3), filed on June 28, 1971 (now U.S. Pat. No. 3,789,267 issued on Jan. 29, 1974), with respect to immobile charge carriers established in the storage medium either by diffusion or ion implantation.

It is to be understood that the above-described arrangements are merely illustrative of the many possible specific embodiments which can be devised to represent application of the principles of our invention. Numerous and varied other arrangements can be devised in accordance with these principles by those skilled in the art without departing from the spirit and scope of the invention. It will be appreciated that suitably injecting Schottky barrier diodes and/or other rectifying barrier means can be substituted for the source zone in the above-described apparatus as an alternative for injecting carriers into the storage medium. With respect to the storage medium, it will further be appreciated that our invention can utilize either n-channel operation (p-type medium) or p-channel operation (n-type medium) provided a suitable reversal of voltage polarities is made. Moreover, our invention may be adapted for use in media which are other than semiconductive. Charge transfer devices utilizing nonsemiconductive medium are described, for example, in U.S. Pat. No. 3,700,932 (Kahng Case 23), issued Oct. 24, 1972. In such apparatus the storage medium may, for example, be an insulator which is not characterized by any one particular conductivity type. In certain of these insulators, zone suitable for injection and collection of carriers can be formed. In others, suitable zones cannot readily be formed. In the latter case, the required injection and collection of carriers in accordance with our invention can be achieved by substituting injecting contacts, for example of the type described in the aforementioned Kahng Case 23, for the zones. These contacts, formed with the surface of the storage medium, may be substituted for the source and drain in our analog inverter in accordance with principles well known in the art.

Finally, it will also be appreciated that the MOS configuration of the collector may be replaced by a p-n diode utilized to drive, for example, an IGFET or other device on the same chip or on a separate chip, e.g., through a beam lead connection.

What is claimed is:

1. Charge transfer apparatus for producing the analog inversion of a non-self-strobing electrical signal comprising:

a storage medium having a major surface, an insulative layer formed on at least a portion of said major surface, source means including a source electrode in operative relation with said medium for injecting mobile charge carriers into said medium, a first control electrode, a reference electrode, a second control electrode, a signal electrode and a collector electrode formed in tandem on said insulative layer, said first control electrode being located between said source and reference electrodes, means for producing a reference potential well in said medium under said reference electrode, two phase clock means for: (1) during a first half of the clock cycle, applying a voltage to said first control electrode effective to cause mobile charge carriers to be injected from said source means into said reference well, said reference well being filled with said carriers to the same predetermined level during every first half of the clock cycle; and (2) during the next half of the clock cycle, applying a voltage to said second control electrode and said collector electrode effective to form in said medium a collecting potential well under siad collector electrode and a potential barrier under said signal electrode and between said reference well and said collecting well, said barrier tending to impede the flow of said mobile charge carriers from said reference well to said collecting well; said clock means and said second control electrode being effective to inhibit the flow of charge carriers from said reference well to said collecting well during said first half of the clock cycle and being effective to sample said non-self-strobing signal when it is a purely analog signal; and means for applying, during at least said next half of the clock cycle, said non-self-strobing electrical signal to be inverted to said signal electrode, thereby varying the height of said potential barrier and causing an amount of charge, the inverted charge, proportional to said analog inversion of said electrical signal to flow out of said reference well, over said barrier and into said collecting well.

2. The apparatus of claim 1 wherein said electrical signal to be inverted is derived from a charge storage site of a charge transfer device and wherein the total capacitance associated with said reference electrode and said second control electrode is approximately twice the capacitance associated with said storage site.

3. The apparatus of claim 1 wherein said storage medium comprises a semiconductive body of a first conductivity type, and said source means comprises a p-n junction diode formed in said medium under said source electrode.

4. The apparatus of claim 1 including asymmetric potential well means in operative relation to said medium and said collector electrode for inhibiting the flow of mobile charge carriers from said collecting well to said reference well.

5. The apparatus of claim 4 wherein said asymmetric potential well means comprises a localized region of immobile charge carriers located in said medium under said collector electrode and on the side therefrom nearer to said reference electrode.

6. The apparatus of claim 4 wherein said asymmetric potential well means comprises a localized region of said insulative layer under said collector electrode, which region is thicker under the side of said collector electrode nearer to said reference electrode than the side remote therefrom.

* * * * *

UNITED STATES PATENT AND TRADEMARK OFFICE
CERTIFICATE OF CORRECTION

PATENT NO. : 3,935,477
DATED : January 27, 1976
INVENTOR(S) : Robert J. Strain and Robert H. Walden It is certified that error appears in the above-identified patent and that said Letters Patent are hereby corrected as shown below:

Column 1, line 29, change "bankpass" to --bandpass--.

Column 3, line 12, equation (4), change "$\Delta U_T$" to --$\Delta V_T$--.

Column 3, line 20, equation (5), change

"$Q_{sig} = \Delta \aleph - \Psi_{sig} C_o = (V_o - V_{sig}) C_o$"

to

--$Q_{sig} = \Delta V_{sig} C_o = (V_o - V_{sig}) C_o$--.

Column 3, line 36, change equation (8),

"$V_{inv} = V_o - \Delta V_{inv} = v_o - Q_{inv}/C_o$"

to

--$V_{inv} = V_o - \Delta V_{inv} = V_o - \dfrac{Q_{inv}}{C_o}$--.

Column 3, line 41, after "V' = A' - B(t)" insert --(2)--.

Column 5, line 23, change "<" to -->--.

Signed and Sealed this eighteenth Day of May 1976

[SEAL]

Attest:

RUTH C. MASON
*Attesting Officer*

C. MARSHALL DANN
*Commissioner of Patents and Trademarks*